United States Patent [19]

Di Mino et al.

[11] Patent Number: 4,714,911

[45] Date of Patent: Dec. 22, 1987

[54] TECHNIQUE FOR TREATING MANUFACTURED THICK FILM RESISTORS

[75] Inventors: Alfonso Di Mino; Andre Di Mino, both of Woodcliff Lake, N.J.

[73] Assignee: ADM Tronics Unlimited, Inc., Northvale, N.J.

[21] Appl. No.: 48,416

[22] Filed: May 11, 1987

Related U.S. Application Data

[63] Continuation-in-part of Ser. No. 909,475, Sep. 19, 1986, Pat. No. 4,705,931.

[51] Int. Cl.⁴ .............................................. H01C 10/00
[52] U.S. Cl. .................................. 338/195; 29/610 R; 219/69 C
[58] Field of Search ....................... 338/195; 219/69 C; 29/610 R

[56] References Cited

U.S. PATENT DOCUMENTS

| | | | |
|---|---|---|---|
| 3,308,528 | 3/1967 | Bullard et al. | 29/610 R X |
| 3,649,801 | 3/1972 | Cardell et al. | 338/195 X |
| 3,676,633 | 7/1972 | Di Mino | 219/69 C |
| 4,210,996 | 7/1980 | Amemiya et al. | 29/610 R |

Primary Examiner—C. L. Albritton
Attorney, Agent, or Firm—Michael Ebert

[57] ABSTRACT

A technique for treating a thick film resistor subsequent to manufacture to correct its value and at the same time enhance its electrical characteristics, such as its resistance stability. Use is made for this purpose of a generating unit in which a radio-frequency carrier is overmodulated by a sonic signal to produce periodic bursts of radio-frequency energy at a repetition rate determined by the frequency of the signal. Coupled to the unit is an UP probe whose tip when brought into contact with the surface of the resistor and scanned thereacross acts to bring about an increase in its ohmic value. Also coupled to the unit is a DOWN probe from whose tip is projected a corona discharge beam which when directed toward the resistor and scanned thereacross to irradiate the resistor acts to decrease its ohmic value. By first raising the value of the manufactured resistor above the desired target value with the UP probe and then decreasing its value with the DOWN probe until the target value is attained, this treatment serves not only to correct the value of the resistor but also to enhance its electrical characteristics.

5 Claims, 5 Drawing Figures

TECHNIQUE FOR TREATING MANUFACTURED THICK FILM RESISTORS

RELATED APPLICATION: This application is a continuation-in-part of the copending application of Alfonso Di Mino, Ser. No. 909,475, filed Sept. 19, 1986, U.S. Pat No. 4,705,931 whose entire disclosure is incorporated herein by reference.

BACKGROUND OF INVENTION

1. Field of Invention

This invention relates generally to a technique for enhancing the electrical characteristics of thick film resistors incorporated in microelectronic chips, and more particularly to a technique for this purpose which acts to effect an increase and then a decrease in the ohmic value of a thick film resistor to bring it to its target value, in the course of which treatment the characteristics of the resistor are significantly enhanced.

2. Status of Prior Art

Microelectronics is that branch of the electronics art which deals with extremely small components, assemblies or systems. In one well-known form of microelectronic structure, resistors, capacitors and conductors are formed by depositing chemical materials onto the surface of a substrate to define a "thin-film" circuit. In another form, a substrate is also employed, but resistors and conductors are printed onto its surface, all other circuit components, such as capacitors, diodes, etc., being discrete elements. This type of microelectronic structure is known as "thick-film" or a ceramic printed circuit. Ceramic printed circuits are the main concern of the present invention, for these may be inexpensively mass produced, and, because of their compactness, light weight and low cost, they are widely used in many forms of modern electronic equipment.

Thick film resistors are made by deposition on an insulating substrate such as alumina, using screening, firing or pyrolytic deposition techniques. Screening is the most commonly used technique, a resistive paste being squeezed onto the substrate through a stainless steel or silk mesh. To stabilize the ohmic value of the resistor, after it is dried, the resistor is fired, typically for about 30 minutes at 600° to 900° C. Commonly used thick films are usually mixtures of palladium or ruthenium with conductive metals such as silver or gold. The absolute value tolerances of a typical thick film resistor lie in a range of ±20° (Roydn D. Jones, *Hybrid Circuit Design and Manufacture*, Marcel Dekker, Inc., Publishers, 1982).

While this fabrication technique gives rise to resistance values which are fairly close to the required tolerances, it is still necessary to make a final adjustment, for it is not possible to lay down precision resistors. When close tolerances are required, resistors are often designed for about 80% of their target value and then trimmed to the desired value. With existing abrasion trimming methods using air or sandblasting, one percent tolerance is achievable by the physical removal of resistive material embedded in the resistor deposit following the firing cycle. Removal of this material from the edge of the printed resistor by an abrasion unit gives positive control of precision resistance values.

Nevertheless, the abrasion technique for trimming resistors has many serious drawbacks, for it not only degrades or destroys the physical qualities of the resistors, but it also reduces their physical dimensions, with an accompanying loss in power-handling capacity. Moreover, the abrasion technique is capable only of effecting an increase in resistance value so that if the resistor value, as printed, is initially too high, it is not correctable and the resistor must be rejected.

Another known thick film trimming technique is oxidation in which the resistor films are treated in an oxidizing atmosphere, causing some of the material to become oxidized, thereby increasing the total resistance value.

In the laser trimming technique which is now widely used, a small portion of the film resistor is selectively evaporated to increase its effective resistance. In this procedure, a focused laser beam is first moved at right angles to the resistor for coarse trimming, and as the resistor approaches its final value, the beam is moved parallel to the resistor length for fine adjustment.

In projecting a jet of sand or other abrasive material against the resistor surface, it is difficult to control the degree of attrition, as a consequence of which the ohmic value may be caused to rise beyond the desired tolerance. Since correction can only be effected unidirectionally, in the event the trimming action overshoots the desired value, the resistor is no longer correctable and must be rejected. Thus, printed resistors which initially are too high in value or which have been excessively trimmed are beyond correction with existing abrasion trimming techniques. This drawback is also experienced in laser trimming techniques which act to raise the ohmic value of a thick film resistor but cannot reduce the value.

A single defective resistor in a ceramic printed circuit renders the entire circuit unacceptable, and a mistake in trimming one resistor in a printed circuit assembly makes it necessary to reject the entire circuit. The likelihood of a single error is particularly great when the assembly includes a large number of resistors such as in a ladder network. In practice, therefore, with existing trimming techniques, the rejection rate is quite high. This factor raises manufacturing costs substantially.

U.S. Pat. Nos. 3,676,633 and 3,646,684 (hereinafter referred to as the Di Mino patents) disclose an electronic technique for trimming the ohmic value of a resistor included in a microelectronic circuit to effect a correction in either direction with respect to the initial value of the resistor without, however, changing its physical dimensions.

Apparatus for this purpose disclosed in these Di Mino patents includes a high-frequency oscillator having a resonator coil to produce an R-F carrier, the oscillator being modulated by an audio-frequency signal to create pulsatory R-F energy. The resonator coil is inductively coupled to a step-up coil connected to a "Down" probe which produces a corona discharge beam that when directed to a point on the resistor acts to reduce its ohmic value. The resonator coil is also inductively coupled to a step-down coil connected to an "Up" probe which when brought into physical contact with a point on the resistor produces a current flow therein that acts to increase the value of the resistor. The extent of such ohmic change is determined by the duration of the treatment and by the area of the resistor subjected to treatment.

At the time the Di Mino patents were granted, the dimensions of a typical resistor network chip or wafer containing resistors that required trimming was approximately one square inch, and the only way one could trim these resistors was to bring the chip into the close proximity of the probes to perform the required trimming operations. Currently, however, the typical resistor network chip is greatly reduced in size and is in many cases about a tenth of the size of the chips previously produced. One cannot as a practical matter handle these tiny chips to effect trimming by the apparatus disclosed in the Di Mino patents.

Modern production procedures make use of servo mechanisms or X-Y positioning tables to position a device to be worked on relative to a tool or other apparatus to carry out the work. Apparatus of the type disclosed in the Di Mino patents does not lend itself to incorporation in a servo mechanism or an X-Y positioning table, for the apparatus is relatively massive and cannot readily be manipulated.

The above-identified copending Di Mino patent application discloses a system for trimming the ohmic value of a resistor included in a microelectronic chip to raise or lower its value without changing its physical dimensions, which system makes it possible to manipulate the Up and Down probes so that they can be brought into operative relation to the chip, thereby dispensing with the need to handle the chip to bring it into the proximity of the probes. A significant advantage of this system is that it lends itself to use with servo mechanisms or X-Y positioning tables on a production line to carry out resistor trimming operations at a relatively rapid rate.

The system disclosed in the Di Mino copending application is provided with a self-contained unit which generates a low radio-frequency carrier overmodulated by a sonic frequency signal to yield at its output terminal pulsed radio-frequency energy. Coupled by an extension cable to the output terminal of the unit is a portable probe assembly whose position may be manipulated to bring the assembly into operative relation with the resistor to be trimmed.

The portable assembly includes a tank circuit connected by the cable to the output terminal of the unit and tuned to the carrier frequency so that the pulsed energy is stored therein and not radiated. A "Down" probe is inductively coupled in step-up relation to the tank circuit to cause a corona discharge beam to be projected from the tip of this probe, which beam when directed toward a point on the resistor acts to irradiate the resistor to reduce its ohmic value. An "Up" probe is inductively coupled in step-down relation to the tank circuit so that when this probe is brought into contact with a point on the resistor, the resultant heating current acts to increase its ohmic value.

The concern of the present invention is with the parameters of thick film resistors; that is, their significant electrical characteristics. These electrical characteristics are the resistance stability of the resistor (ohms per square), its temperature coefficient of resistance (ppm/° C.), its voltage coefficient of resistance, and its noise level. These characteristics leave much to be desired in manufacturing thick film resistors and they are not improved by known trimming techniques and indeed are degraded in the case of abrasion trimming.

SUMMARY OF INVENTION

The main object of this invention is to provide a technique which makes use of UP and DOWN probes in conjunction with a generator unit of the type disclosed in the Di Mino patent application, the technique serving to so alter the ohmic resistance of a manufactured thick film resistor as to attain a desired target value, and in doing so to impart improved electrical characteristics to the resistor.

More specifically, an object of this invention is to provide a technique in which the ohmic value of the manufactured resistor is first raised by the UP probe to a value above the target value and then reduced by the DOWN probe until the value assumes the desired target value, in the course of which treatment the electrical characteristics of the resistor are enhanced.

To carry out this technique, use is made of a generating unit in which a low radio-frequency carrier is overmodulated by a sonic signal to periodically interrupt the carrier and thereby produce periodic bursts of radio-frequency energy at a repetition rate determined by the sonic frequency, the UP probe being coupled to this unit by a step-up transformer and the DOWN probe by a step-down transformer, the combined effect of heating current and ionic radiation serving to enhance the electrical characteristics of the resistor.

BRIEF DESCRIPTION OF DRAWINGS

For a better understanding of the invention as well as other objects and further features thereof, reference is made to the following detailed description to be read in conjunction with the accompanying drawings, wherein.

DESCRIPTION OF INVENTION

Figure 1:
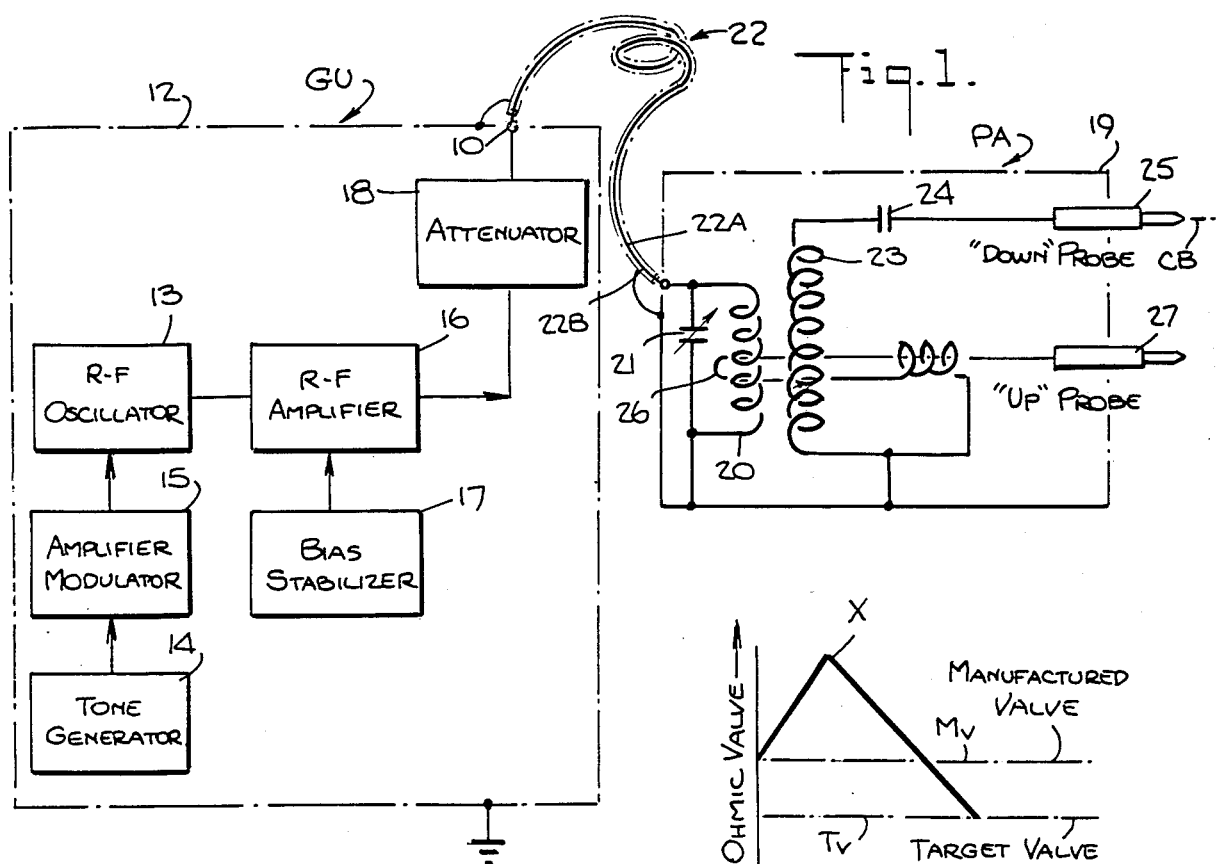
FIG. 1 is a schematic diagram of a system for practicing a technique in accordance with the invention.

Referring now to FIG. 1, there is shown a system for practicing a technique in accordance with the invention. The system is composed of a generating unit GU that produces a low radio-frequency carrier overmodulated by a sonic frequency signal to yield at its output terminal 10 pulsed radio-frequency energy, and a probe assembly PA coupled to this generating unit by a coaxial extension cable 11.

Unit GU, which is housed within a grounded shielding box 12, includes a low radio-frequency generator 13 producing a carrier lying in the frequency range of 200,000 to 300,000 Hz. The generator is frequency-controlled by a piezoelectric crystal oscillator operating at, say, 200 kHz, the carrier generator being stabilized as to amplitude.

The term "low radio-frequency" as used herein refers to that band in the R-F spectrum which lies in the 100,000 to 1,000,000 Hz frequency range normally reserved for long distance radio telegraphy. Any conventional stable, low radio frequency generator may be used in the system.

Also included in the unit GU is an audio-frequency or tone generator 14 to produce a sonic signal in the frequency range of about 3000 to 5000 Hz. This sonic signal is amplified in amplifier/modulator 15 and is applied as a modulating signal to R-F generator 13. In practice, the tone generator is preferably a solid state, transistorized oscillator yielding a steady monovalent signal, with tolerances as minimal as present standards will allow. Amplifier/modulator 15 is preferably also a solid state device.

The modulated carrier from R-F generator 13 is applied to an R-F amplifier 16 whose output amplitude is regulated by a bias stabilizer 17 to maintain a constant peak amplitude. The output of R-F amplifier 16 is applied to output terminal 10 through an adjustable attenuator 18. Unit GU is a self-contained unit and also includes the necessary power supplies for the stages thereof, all of which are housed within the shielding box.

In amplitude-modulation, the amplitude of a high-frequency carrier is caried in accordance with the sonic signal, and the resultant modulated wave containing side bands that are the sum and difference of the carrier and signal frequencies. When the modulation index "M" is zero, no signal formation is conveyed to the carrier. Where, however, M=1 (100% modulation), then in the case of a sinusoidal carrier wave, the envelope of the carrier varies from zero to twice the value of its unmodulated amplitude. But if "M" exceeds unity, the carrier is then overmodulated, as a consequence of which the carrier is periodically interrupted at a repetition rate in accordance with the audio-frequency signal.

Figure 2:
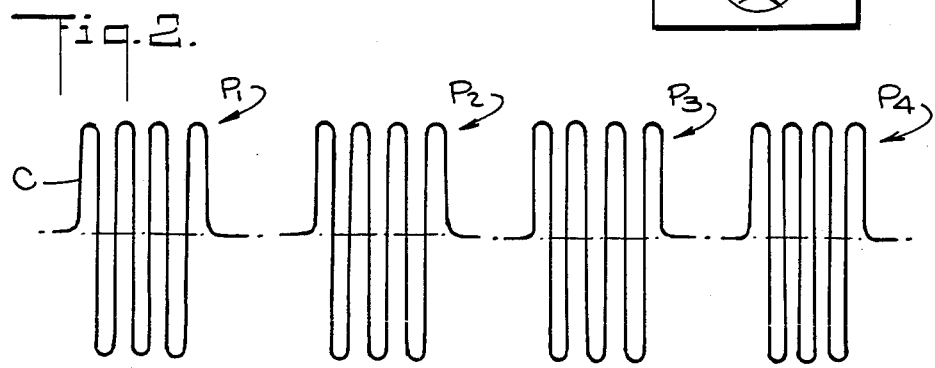
FIG. 2 illustrates the waveform of the output of the system shown FIG. 1.

In the present invention, as shown in FIG. 2, the radio-frequency carrier C is overmodulated by the sonic frequency signal this resulting in periodic bursts $P_1$, $P_2$, $P_3$, etc. of radio-frequency energy whose repetition rate is at the sonic frequency. These bursts of radio frequency energy are yielded at the output terminal 10 of unit GU.

Probe assembly PA is housed in a small insulated tube 19 and is portable. Assembly PA includes a tank circuit formed by a tank coil 20 and a variable capacitor 21 in parallel therewith. One end of coil 20 is coupled by the inner conductor 22A of the coaxial extension cable 22 to the output terminal 10 of generator unit GU. The tubular outer conductor 22B of cable 22 is connected at one end to shield 12 of generator unit GU which is grounded and at the other end to the ground end of coil 20. Tube 19 therefore serves as a convenient handle for the probe assembly.

A tank circuit of the type disclosed is capable of storing R-F energy over a band of frequencies continuously distributed about the resonant frequency of the circuit which in this instance is tuned to the carrier frequency of R-F oscillator 13 in the generator unit GU. Coaxial cable 22 does not function as a radiating antenna, and all energy produced by the generating unit is stored in tank circuit 20–21.

Inductively coupled to tank coil 20 of the tank circuit is a step-up coil 23, the two coils functioning as a step-up transformer whose step-up ratio depends on the number of turns in coil 20 relative to coil 23. One end of step-up coil 23 is grounded, the other end being connected through a fixed coupling capacitor 24 to a tipped "Down" probe 25, so called because it serves to decrease or bring down the value of a resistor being treated by this probe. Because all of the pulsed R-F energy from the generator unit GU is stepped up and transferred to the tip of "Down" probe 25, a corona discharge beam CB is axially projected from this tip.

As is well known, corona is the phenomenon of air breakdown when the electric stress at the surface of a conductor exceeds a certain value. At higher values, the stress results in a luminous discharge. At a still higher critical voltage value, spark-over occurs. In the present invention, the R-F voltage level is such as to produce a luminous corona discharge.

Step-up coil 23 is shock excited by the bursts $P_1$, $P_2$, etc. of the radio-frequency energy, the resultant damped wave surges having a high peak amplitude. This causes the desired corona discharge to produce a pencil beam which is both visible and audible. The reason it is visible is that the corona beam produces a blue glow, and the reason it is audible is that the bursts of energy are at a sonic rate and can therefore be heard. In practice, the power output of the system may be in the order of 5 to 15 watts, and since it is not radiated, it produces no interference.

Inductively coupled to tank coil 20 and step-up coil 23 is a single turn "blind" coil 26, one end of which is connected to an "Up" probe 27, so called because it serves to increase or bring up the value of the resistor being trimmed.

Figures 3, 4:
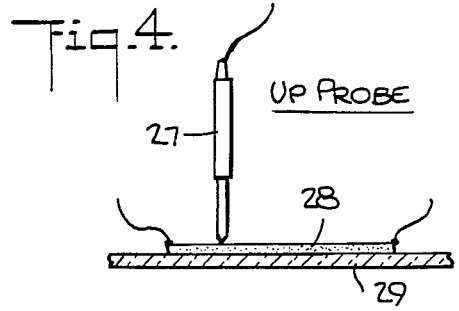
FIG. 3 shows the manner in which the system acts to increase the ohmic value of a thick film resistor.
FIG. 4 shows the manner in which the system acts to decrease the value of the same resistor.

When, as shown in FIG. 3, the tip of "Down" probe 25 is brought into the vicinity of thick film resistor 28 mounted on the substrate 29 of a chip, the corona discharge beam CB when it is scanned across the resistor acts to irradiate the resistor at the points of impingement. The resistive material so irradiated is subjected to an ionic action affecting its ohmic value and electrical characteristics.

Resistor 28 is connected in the circuit of an ohmmeter 30 having an analog or digital readout so that its value may be read as trimming is carried out. It has been found, for reasons which are not understood theoretically, that when a scanned zone on the surface of a printed circuit resistor is subjected to the corona discharge, the resistive properties thereof are so affected as to cause a decrease in resistance. The extent of this change at the point of irradiation depends on the duration of corona exposure, although as the discharge continues, the ohmic change tends to level off.

In practice, particularly when used in mass production, the system may be automated by an arrangement acting to switch off the corona discharge at the instant the manufactured resistor attains its precise target value.

To increase the value of the thick film resistor, then Up probe 27, as shown in FIG. 4, is brought into direct contact with resistor 28 and scanned thereacross. Since the single-turn coil coupled to this probe yields a relatively low voltage having a high current density, no corona is produced, but the resultant heating current which passes through the resistor brings about an upward change in resistance value. By observing this change on the ohmmeter, one may maintain probe contact or current flow until a desired increased resistor value is attained.

The effect of the "Down" and "Up" probe operations is reversible within certain limits, so that if one inadvertently overshoots the resistance value with one probe, it is possible to correct it with the other. Thus, the invention virtually does away with rejections as a result of trimming and makes possible the economical and rapid production of printed resistors having precise values.

We have discovered that with thick film resistors manufactured to tolerances of ±20% it is possible to enhance the electrical characteristics thereof while correcting the values of these resistors in the manner previously described to attain a desired target ohmic value.

To carry out the necessary tests, thick film resistors were printed on alumina substrates and fired according to recommended manufacturers' profiles. Among the commercial resistor inks used in our study and the maximum UP and DOWN adjustment found possible using the system previously described for this purpose, are those inks set out in the table below:

| Ink | Maximum Resistor Adjustment | | |
|---|---|---|---|
| | Ohms/square | Down | Up |
| Cermalloy 8131 | 1K | 3% | 60% |
| Cermalloy 8241 | 10K | 92% | 52% |
| EMCA 5513 | 1K | 3% | 247% |
| EMCA 5014 | 10K | 46% | 300% |
| EMCA 5515 | 100K | 75% | 1% |
| duPont 1739 | 10K | 16% | 1% |
| duPont 1749 | 100K | 35% | 50% |

It will be evident from the table that no two inks have the same properties, and that some can be downwardly adjusted in resistance to a major degree, while others can only be downwardly adjusted to a minor degree, this being also true of upward resistance adjustment.

Figure 5:
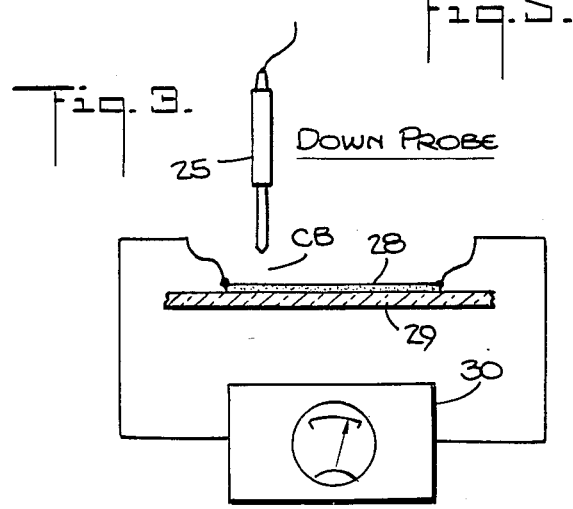
FIG. 5 is a graph showing the change in resistance that takes place in the course of treatment of a manufactured thick film resistor.

In practicing a technique in accordance with the invention, one knows, as shown in FIG. 5, the desired target $T_v$ value for the thick film resistor being treated, and one knows by measurement its manufactured value $M_v$ which in the graph is higher than the target value. In practice, however, the ohmic value of the manufactured resistor may be lower than the target value.

In the example illustrated in the graph where the manufactured ohmic value $M_v$ is above target value $T_v$, the UP probe is first applied to the resistor to further increase its ohmic value to a peak level X, and then the DOWN probe is applied to reduce the resistance to level $T_v$, at which point the resistor has the desired value.

Thus, in the course of this treatment the manufactured resistor has the benefit of both heating current flow through its body as well as ionic irradiation thereof. These combined actions have been found to improve the resistance stability, the temperature coefficient of resistance and the voltage coefficient of resistance, as well as to reduce the noise level of the resistor. The extent of this enhancement depends on the ink used and its properties; but while some resistors exhibit a more marked improvement than others, in substantially all cases, there is a measurable improvement.

Should the manufactured value of the thick film resistor be below target value, the UP probe is used to bring the resistance to peak X above the target value $T_v$, and then the DOWN Probe is used to reduce the resistance to target value. Hence the thick film resistor has the benefit of both actions.

It is to be noted that in the technique as practiced in the manner disclosed in our copending application, if the manufactured thick film resistor had a measured ohmic value below its target value then the DOWN probe would be used to raise its value, whereas if it had a measured value above target value, then the UP probe would be used to reduce the value to the target value. In the present invention, in order to impart enhanced electrical characteristics to the manufactured resistor as well as to correct its ohmic value, regardless of whether the ohmic value of the manufactured resistor is above or below its target value, in either case it is subjected to both UP and DOWN treatment, for it is the combined effect of this treatment which is beneficial, quite apart from its effect on ohmic value. Hence even in the unlikely event that the resistor, as manufactured, has an ohmic value matching the desired target value, it would still be treated to enhance its electrical characteristics.

While there has been shown and described a preferred embodiment of a technique for treating manufactured thick film resistors in accordance with the invention, it will be appreciated that many changes and modifications may be made therein without, however, departing from the essential spirit thereof.

We claim:

1. A technique for enhancing the electrical characteristics of a thick film resistor which is manufactured to tolerances of about ±20% while correcting ohmic value so that its final resistance has a desired target value, said technique comprising the steps of:
   A. measuring the resistor to determine its manufactured value;
   B. conducting a heating current through the resistor to cause its resistance to rise to a peak value well above the target value; and
   C. subjecting the resistor to a corona discharge beam irradiating the body thereof to cause its resistance value to decrease from the peak to the target value whereby the combined effect of heating and irradiation enhances the characteristics of the resistor and imparts thereto the desired final value.

2. A technique as set forth in claim 2, wherein said thick film resistor is produced by an electrically resistive ink printed on a ceramic substrate.

3. A technique as set forth in claim 2, wherein said resistor has a manufactured value in a range from about 100 ohms to at least one megohm.

4. A technique as set forth in claim 1, wherein said heating current is derived from the tip of an UP probe which makes contact with the surface of the resistor, to which probe is applied periodic bursts of radio-frequency energy whose repetition rate is at a sonic frequency.

5. A technique as set forth in claim 4, wherein said corona discharge beam is derived from the tip of the DOWN probe which is brought near the surface of the resistor, to which probe is applied periodic bursts of radio-frequency energy whose repetition rate is at a sonic frequency.

* * * * *